(12) United States Patent
Maki, Jr.

(10) Patent No.: US 9,401,470 B2
(45) Date of Patent: Jul. 26, 2016

(54) ELECTRICAL CONTACTS TO A RING TRANSDUCER

(75) Inventor: Voldi E. Maki, Jr., Austin, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 583 days.

(21) Appl. No.: 13/880,220

(22) PCT Filed: Apr. 11, 2011

(86) PCT No.: PCT/US2011/031972
§ 371 (c)(1),
(2), (4) Date: Apr. 18, 2013

(87) PCT Pub. No.: WO2012/141683
PCT Pub. Date: Oct. 18, 2012

(65) Prior Publication Data
US 2013/0207518 A1    Aug. 15, 2013

(51) Int. Cl.
*H01L 41/047* (2006.01)
*H01L 41/09* (2006.01)
*H01L 41/08* (2006.01)
*B06B 1/06* (2006.01)
*G01V 1/143* (2006.01)
(Continued)

(52) U.S. Cl.
CPC .......... *H01L 41/0825* (2013.01); *B06B 1/0662* (2013.01); *G01V 1/143* (2013.01); *H01L 41/047* (2013.01); *H01L 41/0475* (2013.01); *H01L 41/1132* (2013.01); *H01L 41/25* (2013.01); *H01L 41/29* (2013.01); *Y10T 29/42* (2015.01)

(58) Field of Classification Search
CPC ..... H01L 41/083; H01L 41/047; H01L 41/39; H01L 41/107; H01L 41/472; H01L 41/0926; H01L 41/09; H01L 41/22; H03H 9/132; H03H 9/19; H03H 9/0595; H03H 9/02157; H03H 3/02; B41J 2/1623; B41J 2/161; G01C 19/5607; G10K 11/32; B06B 1/0655; B06B 1/0644
USPC .......................... 310/365–367, 369; 29/25.35
See application file for complete search history.

(56) References Cited

U.S. PATENT DOCUMENTS 3,114,849 A    12/1963  Poschenrieder
3,179,826 A *   4/1965  Trott et al. ................... 310/363
(Continued)

FOREIGN PATENT DOCUMENTS

DE     1200890      9/1965
DE     3133669   *  3/1983   ................ B06B 1/06
(Continued)

OTHER PUBLICATIONS

"International Serial No. PCT/US2011/031972, International Search Report mailed Feb. 3, 2012", 3 pgs.
(Continued)

*Primary Examiner* — Thomas Dougherty
(74) *Attorney, Agent, or Firm* — Schwegman Lundberg & Woesnner, P.A.; Alan Bryson

(57) ABSTRACT

Various embodiments include apparatus and methods of providing a piezoelectric element having a surface front surface to operate as an active surface of a transducer on which a number of separate electrodes are disposed such that the electrodes on the front surface provide an effectively flat surface to the transducer. Additional apparatus, systems, and methods are disclosed.

24 Claims, 8 Drawing Sheets

(51) Int. Cl.
*H01L 41/25* (2013.01)
*H01L 41/113* (2006.01)
*H01L 41/29* (2013.01)

(56) References Cited

U.S. PATENT DOCUMENTS

| | | | | |
|---|---|---|---|---|
| 3,384,767 | A | * 5/1968 | Arnold et al. | ................. 310/366 |
| 4,156,158 | A | 5/1979 | Wilson et al. | |
| 4,398,116 | A | * 8/1983 | Lewis | ........................... 310/334 |
| 4,446,396 | A | * 5/1984 | Claus et al. | ................... 310/334 |
| 4,523,471 | A | * 6/1985 | Lee | ................. 73/626 |
| 4,611,372 | A | * 9/1986 | Enjoji et al. | ................. 29/25.35 |
| 4,652,785 | A | * 3/1987 | Gabriel et al. | ................ 310/325 |
| 5,044,462 | A | 9/1991 | Maki, Jr. | |
| 5,126,616 | A | 6/1992 | Gorton et al. | |
| 5,317,111 | A | 5/1994 | Orban et al. | |
| 5,354,956 | A | 10/1994 | Orban et al. | |
| 5,704,105 | A | 1/1998 | Venkataramani et al. | |
| 5,923,115 | A | 7/1999 | Mohr, III et al. | |
| 5,977,691 | A | 11/1999 | Stephens | |
| 6,045,208 | A | * 4/2000 | Hirahara et al. | ................. 347/10 |
| 6,466,513 | B1 | 10/2002 | Pabon et al. | |
| 7,508,118 | B2 | 3/2009 | Imahashi et al. | |
| 7,569,975 | B2 | 8/2009 | Nye | |
| 2006/0027400 | A1 | * 2/2006 | Garcia et al. | .................. 175/320 |
| 2010/0156241 | A1 | * 6/2010 | Suzuki et al. | ................. 310/325 |

FOREIGN PATENT DOCUMENTS

| | | |
|---|---|---|
| DE | 3133669 A1 | 3/1983 |
| EP | 0090267 B1 | 2/1987 |
| JP | 53-58794 * | 5/1978 |
| WO | WO-2012141683 A1 | 10/2012 |

OTHER PUBLICATIONS

"International Serial No. PCT/US2011/031972, Written Opinion mailed Feb. 3, 2012", 4 pgs.

"European Application Serial No. 11717380.7, Response filed May 9, 2014 to Communication mailed Nov. 29, 2013", 30 pgs.

"European Application Serial No. 11717330.7, Communication pursuant to Rules 161(1) and 162 EPC mailed Nov. 29, 2013", 2 pgs.

"International Application Serial No. PCT/US2011/031972, International Preliminary Report on Patentability mailed Oct. 24, 2013", 6 pgs.

"Canadian Application Serial No. 2,832,548, Office Action mailed Jul. 7, 2015", 4 pgs.

* cited by examiner

ELECTRICAL CONTACTS TO A RING TRANSDUCER

RELATED APPLICATIONS

This application is a U.S. National Stage Filing under 35 U.S.C. 371 from International Application No. PCT/US2011/031972, filed on 11 Apr. 2011, and published as WO 2012/141683 A1 on 18 Oct. 2012, which application and publication are incorporated herein by reference in their entirety.

TECHNICAL FIELD

The present invention relates generally to apparatus for making measurements related to oil and gas exploration.

BACKGROUND

In drilling wells for oil and gas exploration, understanding the structure and properties of the associated geological formation provides information to aid such exploration. Measurements in a borehole are typically performed to attain this understanding. However, the pressure and temperatures accompanying measurement tools in the borehole of a well can affect operation of these tools in the borehole. The usefulness of such measurements may be related to the precision or quality of the information derived from such measurements.

DETAILED DESCRIPTION

The following detailed description refers to the accompanying drawings that show, by way of illustration and not limitation, various embodiments in which the invention may be practiced. These embodiments are described in sufficient detail to enable those skilled in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Figure 1:
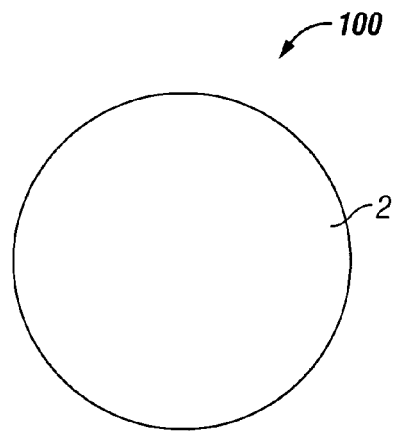
FIGS. 1 and 2 show a top view and a side view, respectively, of an example piezoelectric element to be processed to attach as a sensing unit in an acoustic transducer, in accordance with various embodiments.
Figure 2:
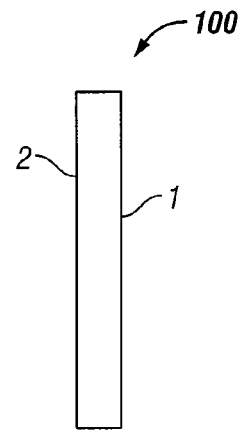
Figure 3:
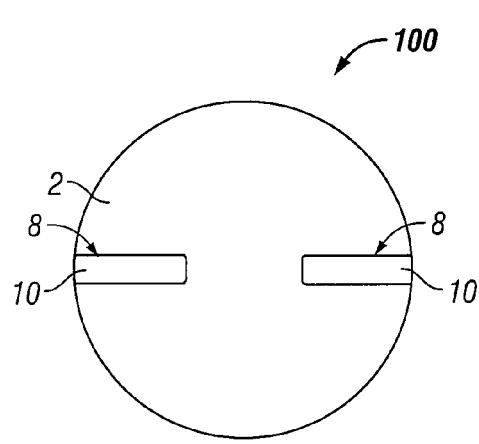
FIG. 3 shows the piezoelectric element of FIGS. 1 and 2 after recesses are cut in the front surface at two locations on the piezoelectric element, in accordance with various embodiments.

FIGS. 1 and 2 show a top view and a side view, respectively, of a piezoelectric element 100 to be processed to attach as a sensing unit in an acoustic transducer. Piezoelectric element 100 has a front surface 2 and a back surface 1, where front surface 2 is to be disposed in the acoustic transducer as the active side of piezoelectric element 100 and back surface 1 can be used to attach to a housing of the acoustic transducer. Front surface 2 can also be referred to as the face of piezoelectric element 100. Piezoelectric element 100 can be realized as a piezoelectric ceramic. Piezoelectric element 100 can be processed to provide an electrical connection to ring electrodes formed on the active surface of piezoelectric element 100 without extending above the surface of the piezoelectric element. FIGS. 3-11 show stages of and/or features in processing piezoelectric element 100 to provide electrical connections to ring electrodes formed on front surface 2 of piezoelectric element 100 effectively without extending above front surface 2 of piezoelectric surface 100. FIG. 3 shows piezoelectric element 100 after recesses 10 are cut in front surface 2 at two locations 8. Recesses 10 can be made as, but are not limited to, 0.005 inch deep recesses with sloped edges or as shallow concave grooves. As shown, the two locations can be formed on a line through the center of piezoelectric element 100, where each location 8 extends from the periphery of piezoelectric element 100 towards the center of piezoelectric element 100. An electrode surface can be applied to front surface 2 and to surface 1, if not already in place.

Figure 4:
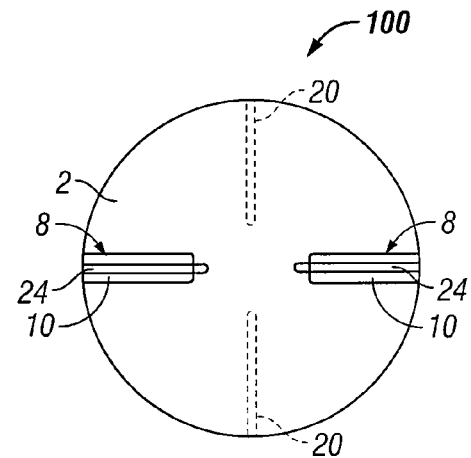
FIG. 4 shows the piezoelectric element of FIG. 3 with slots cut in the back surface of the piezoelectric element, in accordance with various embodiments.

FIG. 4 shows piezoelectric element 100 with slots 24 cut in the front surface of piezoelectric element 100. Slots 20 can also be cut in back surface 1, not shown, offset by 90 degrees from slots in front surface 2, shown in a dotted format indicating that slots 20 are made in the surface opposite front surface 2. As with slots 24, slots 20 do not extend from one surface to the other surface. Slots 24 are made to hold electrode assemblies used to connect electrodes on front surface 2 externally from side edges of piezoelectric element 100 after processing surface connections to piezoelectric element 100. Slots 24 can be used to reduce unwanted modes of vibration of piezoelectric element 100 in operation as part of an acoustic transducer. Slots 20 can also reduce unwanted mode of vibration. The number of slots 20 can be more or less than two and can be arranged at different locations on back surface 1, other than offset 90 degrees from slots 24. Slots 20 can be made before, after, or at the same time as forming slots 24 and can be formed using a diamond-coated disk. Other cutting tools and/or material removal methods can be used. FIGS. 1-4 show piezoelectric element 100 before electrode material is applied to front surface 2 in an example embodiment of a processing procedure to make electrical connections for piezoelectric element 100.

Figure 5:
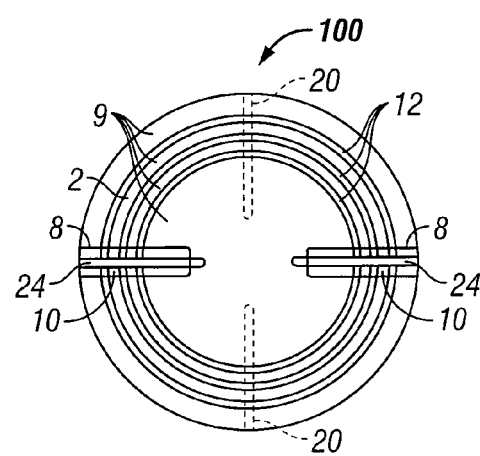
FIG. 5 shows the piezoelectric element of FIGS. 3 and 4 after an electrode material has been applied to the front surface, where cuts have been made in the electrode material to form separated electrodes, in accordance with various embodiments.

FIG. 5 shows piezoelectric element 100 after an electrode material has been applied to front surface 2, having slots 10 at locations 8, and cuts 12 have been made in the electrode material to form separated electrodes 9. Cuts 12 can be made as shallow cuts to separate rings 9 in the electrode material only. There are a number of mechanisms by which the electrode material can be formed on front surface 2. For example, a conductive paste can be applied to front surface 2 using a screen process in which the paste is heated until the carrier solvent is removed leaving a coating of silver on front surface 2. For example, silver can be deposited over the complete front surface 2 of a ceramic piezoelectric 100. Other conductive materials may be used and other procedures can be used to form electrode material on front surface 2 of piezoelectric element 100. Electrode rings 9 can then be generated by cutting out regions 12 in the conductive electrode material in a circle fashion, for example removing silver electrode material off of a piezoelectric ceramic, such that there are breaks in the conductive electrode material forming separate electrodes isolated between the circular cuts 12. Other shapes may be used to form multiple electrodes on piezoelectric element 100.

Figure 6:
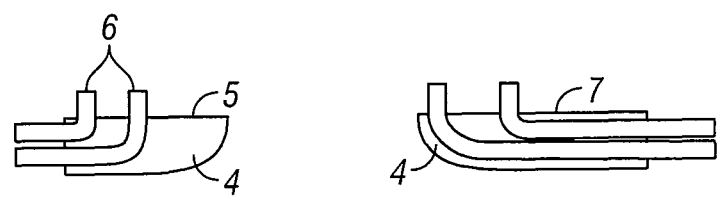
FIG. 6 shows example electrode assemblies that can be disposed in the slots in the piezoelectric element of FIGS. 3-5, in accordance with various embodiments.

FIG. 6 shows an embodiment of example electrode assemblies 5 and 7 that can be disposed in slots 24 of FIGS. 3-5. Each of electrode assemblies, 5 and 7, includes electrical connectors 6 to couple to an electrode 9 on front surface 2. Electrode assemblies, 5 and 7, may comprise a tape 4, such as but not limited to a Kapton tape, and ribbon conductors 6. Ribbon conductors 6 can be configured with tape 4 in arrangement in electrode assemblies, 5 and 7, such that an electrical connection can be made to each of the electrode rings 9. To allow contact to each electrode ring, ribbon conductors 6 can be arranged on tape 4 in electrode assembly 5 near one end of tape 4 compared with ribbon conductors 6 arranged on tape 4 in electrode assembly 7 near the other end of tape 4. Ribbon conductors 6 can be cut having a thickness of approximately 1 mil thick and a width of approximately 20 mils, for example, from sheet material. Ribbon conductors having different dimensions can be used depending on the size of piezoelectric element 100 and the application of piezoelectric element 100 in a transducer. Each conductor 6 can be configured as two layers thick. In an embodiment having four electrode rings and a pair of ribbon conductors 6 with two layers in each of two slots 24, the two electrode assemblies 5 and 7 can provide a total of eight conductors.

Figure 7:
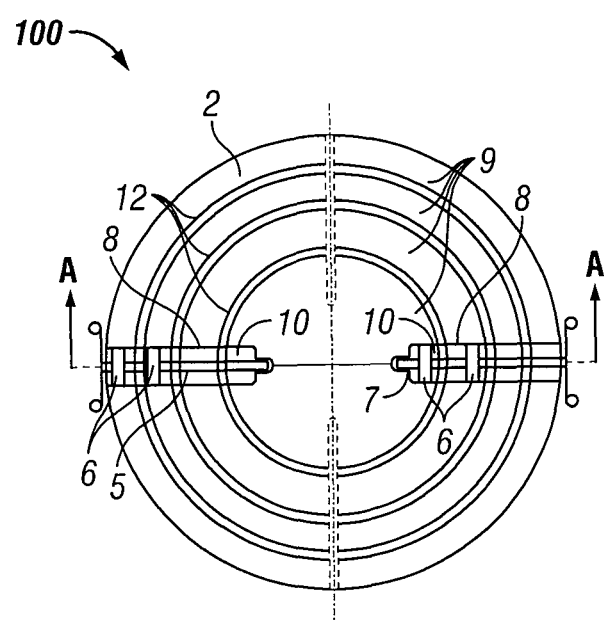
FIG. 7 shows an embodiment of the piezoelectric element of FIGS. 3-5 processed with electrode assemblies attached into the slots in the front surface of the piezoelectric element, in accordance with various embodiments.
Figure 8:
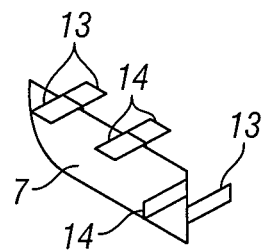
FIG. 8 shows an example an electrode assembly of FIG. 7, where the connections of one ribbon conductor and the connections of a second of a pair of ribbon conductors are in a folded orientation corresponding to the electrode assembly being fitted into the piezoelectric element of FIGS. 3-5 and 7, in accordance with various embodiments.

FIG. 7 shows an embodiment of piezoelectric element 100 processed with electrode assemblies 5 and 7 attached into slots 24. As can be seen in FIGS. 6 and 7, the different orientations of ribbon conductors on electrode assemblies 5 and 7 provide for independent isolated connections individually to each of electrode ring 9. Pairs of ribbon conductors 6 are used in each electrode assembly 5 and 7 so that once installed, the conductors can be folded outwards to connect to the electrode ring on piezoelectric element 100 on each side of slot 24 using a conductive epoxy or soldering methods. As the conductors exit slot 24 on the edge of piezoelectric element 100, the conductors can be folded in opposite directions to allow a stranded wire to be attached to the conductors to provide an external electrical connection to piezoelectric element 100. FIG. 8 shows an example embodiment of assembly 7 of FIG. 7, where connections 13 of one ribbon conductor and connections 14 of the second of the pair of ribbon conductors are in a folded orientation when fitted into a slot 24 of piezoelectric element 100. As such shown, external connections to piezoelectric element 100 can be made at the edges of piezoelectric element 100.

Figure 9:
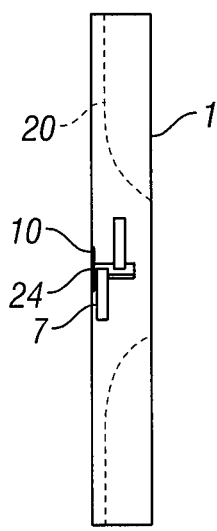
FIG. 9 shows a side view of the piezoelectric element of FIGS. 3-5 and 7 with an electrode assembly affixed in a slot in the front surface of the piezoelectric element with the conductors of the electrode assembly in a folded out configuration, in accordance with various embodiments.

FIG. 9 shows a side view of piezoelectric element 100 having back surface 1 and front surface 2 with electrode assembly 7 affixed in slot 24 in front surface 2 of piezoelectric element 100 with the conductors of electrode assembly 7 in a folded out configuration. As shown, the folded out conductive ribbons lie flat on the electrode material of electrode rings 9. With all connections of piezoelectric element 100 to electrodes 9 made in the same manner, all such connections lie flat in the recesses 10 on their respective electrodes 9 essentially without extending above the surface of the piezoelectric unit formed by the electrodes 9 and piezoelectric element 100. With small ribbon dimensions in the folded out configuration, electrodes 9 can be maintained as flat electrodes.

Figure 10:
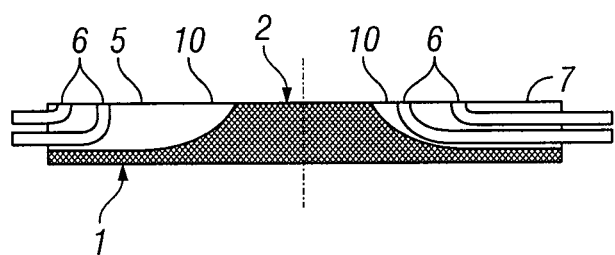
FIG. 10 shows a cross section along line A-A of the piezoelectric element FIG. 7, in accordance with various embodiments.

FIG. 10 shows a cross section along line A-A of piezoelectric element 100 of FIG. 7. Piezoelectric element 100 includes electrode assemblies 5 and 7 formed in slots 10 of piezoelectric element 100. As shown, conductors 6 extend into piezoelectric element 100 from the edge of piezoelectric element 100 at different distances, which allows each conductor 6 to be folded the ring electrode that is at the distance from the periphery of piezoelectric element 100 to which the conductor is disposed to its fold out position.

Figure 11:
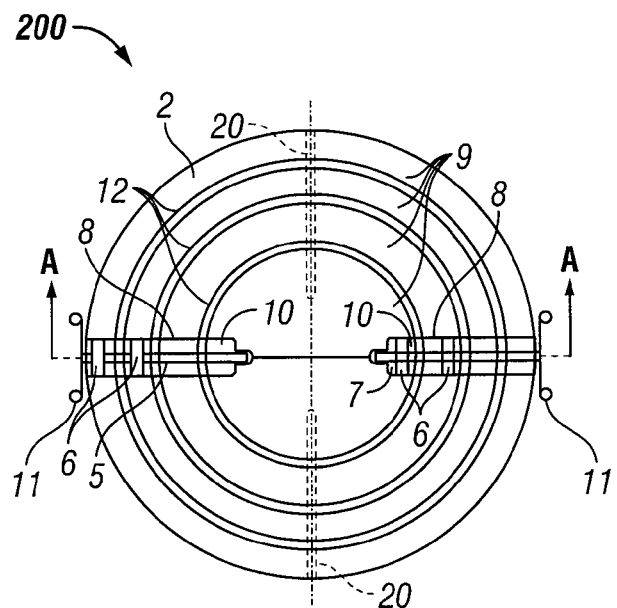
FIG. 11 shows an example of the piezoelectric element of FIG. 7 with electrical wires connected to the piezoelectric element to make electrical connections external to the piezoelectric element without extending above the surface of the piezoelectric element to make the connections, in accordance with various embodiments.

FIG. 11 shows piezoelectric element 100 of FIG. 7 with electrical wires 11 connected to piezoelectric element 100 to make electrical connections external to piezoelectric element 100 without extending above the surface of the piezoelectric element to make the connections. The wires and connections to the ceramic electrode, structured as one electrode or multiple electrodes such as electrode rings, are fully within the surface bounds of the face of the piezoelectric element. Piezoelectric element 100 includes four connections to front face 2, while having front face 2 of piezoelectric element 100 flat with no protrusions.

In the example embodiment of FIG. 11, piezoelectric element 100 has two slots 24 cut in front face 2 at two locations 8 and four electrode rings 9 disposed on front surface 2 separated by cuts 12 in the electrode. The four electrical surfaces of the electrode rings can be driven with appropriate signals to focus an acoustic signal. In like manner, a received signal can be focused from the same distance. Piezoelectric element 100 can also include slots 20 in the back surface offset by 90 degrees from slots 24, where slots 20, which may be configured as four in number, can help to reduce unwanted modes of vibration during operation of piezoelectric element 100 in an acoustic transducer. Slots 24 may also aid in reducing unwanted modes of vibration. Slots 24 include electrode assemblies, 5 and 7, which can consist of Kapton tape and ribbon conductors 6, which folded out provide a total of 8 conductors. As conductors 6 exit slots 24 on the edge of piezoelectric element 100, conductors 6 fold out in opposite directions to allow stranded wire 11 to be attached at the edge of piezoelectric element 100. This lead attachment allows front face 2 of piezoelectric element 100 to be lapped to a fine finish to optimize its acoustic performance when assembled into a final transducer configuration. Piezoelectric element 100 can be realized as a piezoelectric ceramic.

The various procedures to process piezoelectric element 100, such that wires and connections to electrodes disposed on the face of piezoelectric element 100 are fully within the surface bounds of the face of piezoelectric element 100, can be conducted in various orders of processing. For example, after slots are cut in the face of piezoelectric element 100, the electrode assemblies can be attached into the slots of piezoelectric element 100 followed by deposition of electrode material and processing of the electrode material to form the number of isolated, separate electrodes selected for a given application. Before depositing the electrical material, ribbon conductors can be folded on the front surface of piezoelectric element 100 on each side of the slots cut in the front face and connected using conductive epoxy or soldering methods. Piezoelectric element 100 can be further processed to provide to a fine finish to the front face with the folded conductors appropriately sized such that the front surface of piezoelectric element 100 is provided essentially flat. With electrode material disposed on the front surface of piezoelectric element 100 that includes folded out conductors, the electrode material can be processed such that the surface of the electrodes are flat to a specified design, such as but not limited to, based on the operating frequency of the transducer of which piezoelectric element 100 is a component. In addition, the number of slots, electrode rings, shapes of electrodes, and shape of the piezoelectric element can be modified according to the application of the piezoelectric element in an acoustic transducer. For example, the front electrode may include a number of rings different than four rings and may use a configuration different from concentric annular rings, such as square electrode surfaces disposed on the face of the piezoelectric element separated from one another by cuts or appropriate insulating material. Other shapes for the electrodes may be used.

In various embodiments, processing of a piezoelectric element to be used in a transducer can include a number of techniques to attach leads to the piezoelectric element. The piezoelectric element can be configured as a sensing portion of an annular focused transducer. The transducer can be arranged in a housing with electrical connections on the face of the piezoelectric element such that a flat surface for acoustically coupling the piezoelectric element to the housing is maintained. In order to make electrical connections on the face of the piezoelectric element and maintain a flat surface for acoustically coupling the piezoelectric element to the housing, an electrode or electrodes on the face can be configured to provide connections to the edge of the piezoelectric element. A piezoelectric element identical to or similar to the piezoelectric element of FIG. 11 can provide connections to the edge of the piezoelectric element essentially without extending above the surface of the piezoelectric element. The piezoelectric element can be a piezoelectric ceramic and the housing can be structured to operate at pressures and temperatures associated with drilling in a borehole. For example, the housing can be a housing of polyether ether ketone. Polyether ether ketone, commonly referred to as PEEK, is an organic polymer thermoplastic. Other materials appropriate for the pressures and temperatures associated with drilling operations in a borehole can be used. Other procedures and designs can be used to provide electrical connections to an electrode structure, such as a pattern of rings, for a piezoelectric element to allow attaching electrical connections to the edge of the piezoelectric element for transferal of electrical signals to and from the edge of the piezoelectric element. These attachment points can be arranged such that they do not extend above a nominal surface of the piezoelectric element.

Figure 12:
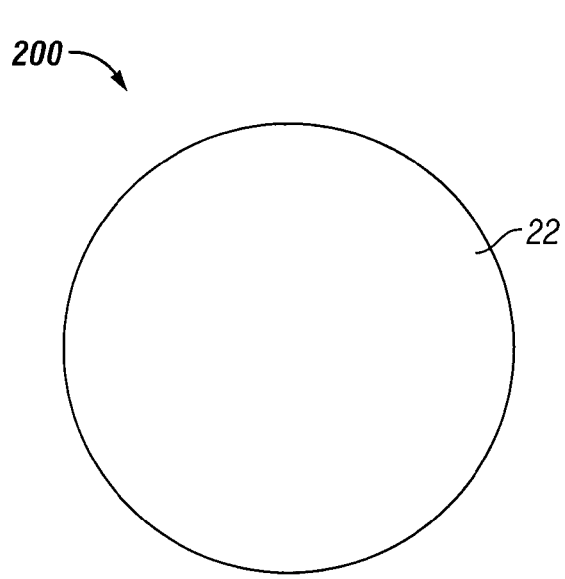
FIGS. 12 and 13 show a top view and a side view, respectively, of an example piezoelectric element to be processed to attach as a sensing unit in an acoustic transducer, in accordance with various embodiments.
Figure 13:
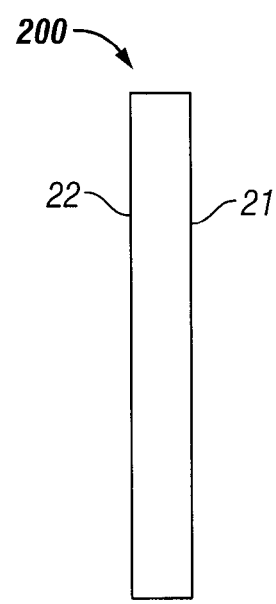

FIGS. 12 and 13 show a top view and a side view, respectively, of a piezoelectric element 200 to be processed for attachment as a sensing unit in an acoustic transducer with electrical attachments at the side of piezoelectric element 200 such that attachment points do not extend above nominal surfaces of the front and back of piezoelectric element 200. Piezoelectric element 200 has a front surface 22 and a back surface 21, where front surface 22 is to be disposed in the acoustic transducer as the active side of piezoelectric element 200 and back surface 21 can be used to attach to a housing of the acoustic transducer. Piezoelectric element 200 can be realized as a piezoelectric ceramic.

Piezoelectric element 200 can be processed to provide an electrical connection to ring electrodes formed on the active surface of piezoelectric element 200. Piezoelectric element 200 can be processed to make electrical connections on the face of piezoelectric element 200 and maintain a flat surface for acoustically coupling piezoelectric element 200 to a PEEK housing, with electrodes configured to provide connections to the edge of piezoelectric element 200. In addition, the contact points for the wires connected to the electrodes can be recessed into piezoelectric element 200 at the point of contact. The bond between a wire and its corresponding electrode can be finished to be at or below the nominal surface of the electrode on piezoelectric element 200.

Figure 14:
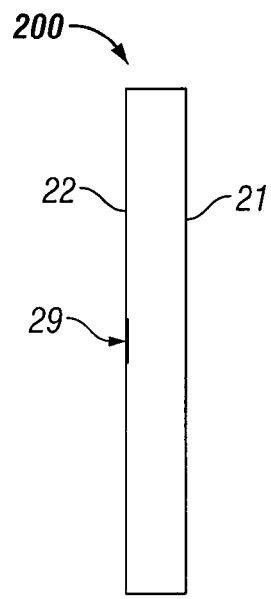
FIG. 14 shows a side view of piezoelectric element of FIGS. 12 and 13 having a recessed area formed at an edge of the piezoelectric element, in accordance with various embodiments.

FIG. 14 shows a side view of piezoelectric element 200 having recessed area 29 formed at an edge of piezoelectric element 200. Recessed area 29 can be cut from piezoelectric element 200 using a diamond-coated disk or other cutting tool and/or material removal methods. Recessed area 29 can be formed before forming an electrode on front surface 22 of piezoelectric element 200.

Figure 15:
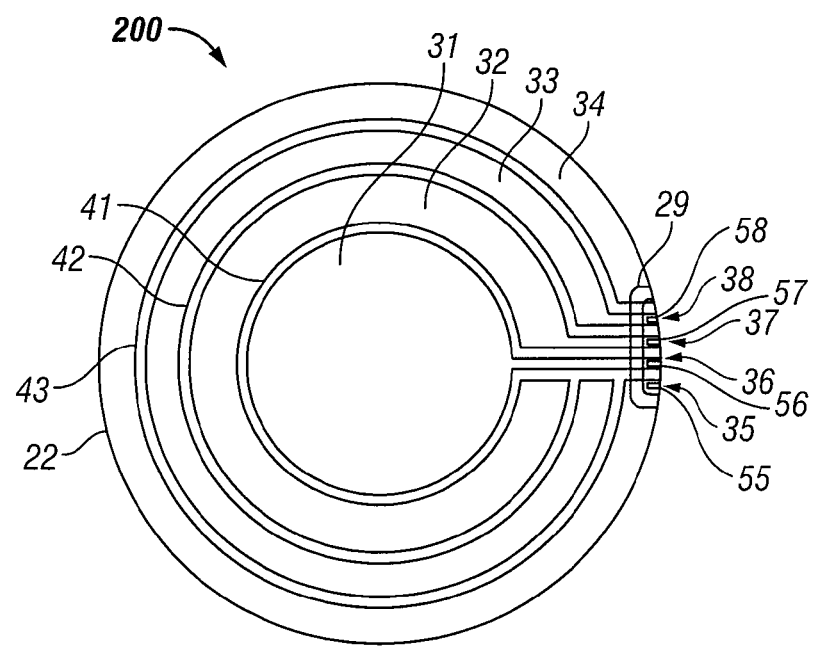
FIG. 15 shows the front surface of the piezoelectric element of FIGS. 12-14 after electrode material is formed on the piezoelectric element and cuts in the electrode material have been made to form separate individual electrodes, in accordance with various embodiments.

FIG. 15 shows front surface 22 of piezoelectric element 200 after electrode material is formed on piezoelectric element 200 and after cuts in the electrode material have been made to form separate individual electrodes 31, 32, 33, and 34, which can be arranged substantially concentric around the center of piezoelectric element 200 on front surface 22. The electrode material and cuts that form multiple electrodes can be made on front surface 22 of piezoelectric element 200 in a manner similar to the manner in which electrode material and cuts that formed multiple electrodes are processed on piezoelectric element 100 of FIGS. 5, 7, and 11. Separate individual electrodes 31, 32, 33, and 34 provide rings, which allow focusing acoustic energy in operation as a transducer. Each pair of electrodes can be isolated by cuts 41, 42, and 43 through the electrode material. Each electrode 31, 32, 33, and 34 can be arranged to be continuous to the edge of piezoelectric element 200 at 36, 37, 38, and 35, respectively. Each electrode 31, 32, 33, and 34 on piezoelectric element 200 can be formed to be continuous into recessed area 29. Recessed area 29 can be recessed by 0.005 inches to 0.01 inches. Recessed area 29 can be structured to other dimensions depending on the size of piezoelectric element 200 and/or the application to which piezoelectric element 200 is designed.

Recessed area 29 provides a region in which each electrode 31, 32, 33, and 34 can be bonded to a corresponding wire 56, 57, 58, and 55 to provide electrical contacts to the edge of piezoelectric element 200. Each corresponding wire 56, 57, 58, and 55 can be realized as a thin flat wire, which can be bonded to its perspective electrode. The bonding can be made using a conductive epoxy in recessed area 29. A wire having dimensions of 0.020 inches wide and 0.002 inches thick can be used. These dimensions can be used to allow the bond to be thin and below the nominal surface of piezoelectric element 200. A stranded wire can be attached to the flat wires 56, 57, 58, and 55 for the external connections to the transducer. The wires 56, 57, 58, and 55 and recessed area 29 can have different dimensions depending on the size of piezoelectric element 200 and/or the transducer application of piezoelectric element 200.

The number of electrode rings, shapes of electrodes, and shape of the piezoelectric element of FIG. 15 can be modified according to the application of the piezoelectric element in an acoustic transducer. For example, the front electrode may include a number of rings different than four rings and may use a configuration different from substantially concentric annular rings, such as square electrode surfaces disposed on the face of the piezoelectric element separated from one another by cuts or appropriate insulating material. Other shapes for the electrodes may be used.

Figure 16:
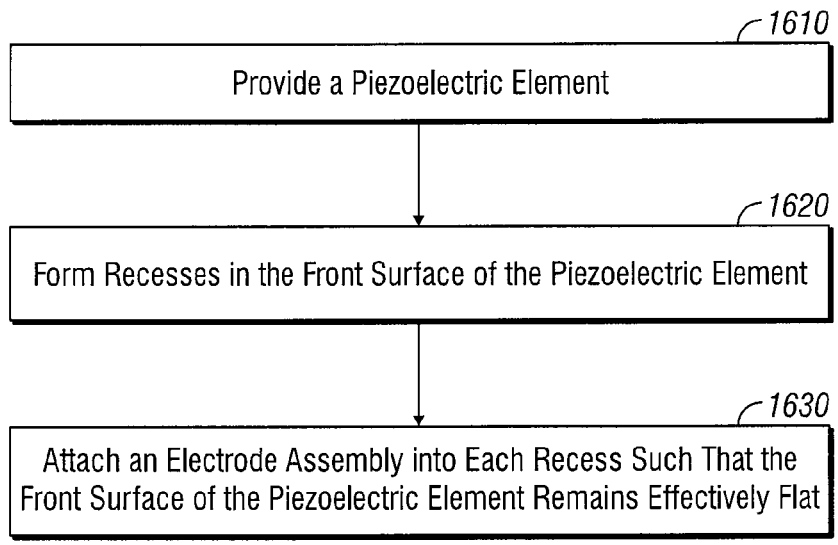
FIG. 16 shows features of a method to couple electrical contacts to a front surface of a piezoelectric element such that the front surface remains effectively flat, in accordance with various embodiments.

FIG. 16 shows features of an embodiment of a method to couple electrical contacts to a front surface of a piezoelectric element such that the front surface remains effectively flat. At 1610, a piezoelectric element is provided. The piezoelectric element has a front surface and a back surface opposite the front surface, where the front surface is arranged to operate as an active surface of an acoustic transducer. At 1620, recesses are formed in the front surface of the piezoelectric element. Electrode material can be applied to the front surface after forming the recesses. The process can include making cuts in the electrode material forming separate rings in the electrode material. Alternatively, electrode material can be applied to the front surface before forming the recesses. The process can also include making cuts in the electrode material forming separate rings in the electrode material.

At 1630, an electrode assembly is attached into each recess. The electrode assembly can be attached into each grove after forming the separate electrode rings or before forming the electrodes. When the electrode assembly is attached before forming electrodes, attaching each electrode assembly can include, after installing each electrode assembly in its respective recess, folding conductors of each electrode assembly outwards on each side of the respective recess to connect to the piezoelectric element on the front surface. Connecting the conductors to the piezoelectric element on each side of the respective recess can include using conductive epoxy or solder. When the electrode assembly is attached after forming the separate electrode rings, attaching each electrode assembly can include, after installing each electrode assembly in its respective recess, folding conductors of each electrode assembly outwards on each side of the respective recess to connect to respective electrode rings on the front surface of the piezoelectric element. Connecting the conductors to each respective electrode ring on each side of the respective recess can include using conductive epoxy or solder.

The process can include attaching wires to the conductors of each electrode assembly folded outwards on each side of the respective recess at an outside edge of the piezoelectric element between the front surface and the back surface. Attaching the wires at the outside edge can be conducted whether the conductors are folded on the front surface of the piezoelectric element or folded on electrodes on the front surface of the piezoelectric element.

In various embodiments, a process to attach electrical contacts to a front surface of a piezoelectric element such that the front surface remains effectively flat can also include forming a number of slots in the piezoelectric element from the back surface towards the front surface such that the slots do not reach the front surface. Further, the process can include lapping the front surface to a specified finish to optimize acoustic performance of the piezoelectric element in the acoustic transducer. After processing a mechanism to connect electrical contacts to the piezoelectric element, the process can include attaching the piezoelectric element to a housing, where the housing is compatible with operation at temperatures and pressures associated with drilling in a borehole. In various embodiments, the piezoelectric element can include a piezoelectric ceramic.

Figure 17:
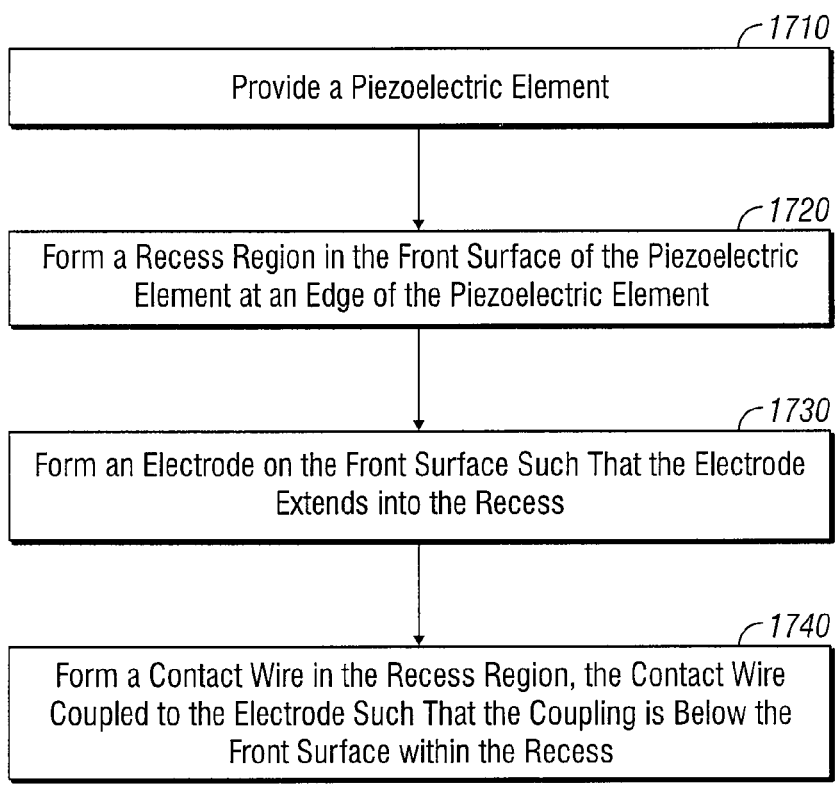
FIG. 17 shows features of an embodiment of a method to couple electrical contacts to a front surface of a piezoelectric element such that the front surface remains effectively flat, in accordance with various embodiments.

FIG. 17 shows features of an embodiment of a method to couple electrical contacts to a front surface of a piezoelectric element such that the front surface remains effectively flat. At 1710, a piezoelectric element is provided. The piezoelectric element has a front surface and a back surface opposite the front surface, where the front surface is arranged to operate as an active surface of an acoustic transducer. At 1720, a recess region is formed in the front surface of the piezoelectric element at an edge of the piezoelectric element.

At 1730, an electrode is formed on the front surface of the piezoelectric element such that the electrode extends into the recess. The process can include forming the electrode on the front surface by forming electrode material on the front surface and making a number of cuts in the electrode material forming a number of separate electrodes electrically isolated from each other by the cuts such that each separate electrode is continuous into the recess region.

At 1740, a contact wire is formed in the recess region, where the contact wire is coupled to the electrode such that the coupling is below the front surface within the recess. The contact wire provides a mechanism to couple the electrode to a wire external to the piezoelectric element. The process can also include forming an individual contact wire to each respective electrode of a set of electrodes in the recess region below the front surface within the recess to couple each electrode to a respective wire external to the piezoelectric element. The process can include bonding each individual contact wire to its respective electrode using conductive epoxy.

After forming electrical contacts to the piezoelectric element, the piezoelectric element can be attached to a housing, where the housing is compatible with operation at temperatures and pressures associated with drilling in a borehole. In various embodiments, the piezoelectric element includes a piezoelectric ceramic.

Figure 18:
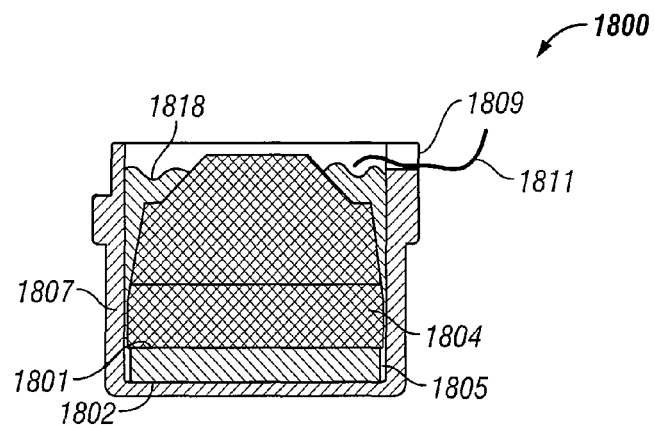
FIG. 18 shows an example apparatus having a piezoelectric element disposed in a housing, in accordance with various embodiments.

FIG. 18 shows an embodiment of an example apparatus 1800 having a piezoelectric element 1805 disposed in a housing 1807. Piezoelectric element 1805 has a first surface 1802 and a second surface 1801 opposite first surface 1802. First surface 1802 of piezoelectric element 1805 can be arranged as a front surface to couple in the transducer as a sensing element and second surface 1801 can be arranged as a back surface 1801 that couples to a backing material 1804. Backing material 1804 can be bonded to back surface 1801 and backing material 1804 can be bonded to housing 1807 to provide stability for piezoelectric element 1805.

Piezoelectric element 1805 can be realized similar or identical to a piezoelectric element associated with one or more of FIGS. 1-17. Piezoelectric element 1805 can be arranged with a set of separate electrodes such that each electrode is connected at the edge of piezoelectric element 1805 to wires 1811 providing electrical paths for signals to and from piezoelectric element 1805. In some embodiments, piezoelectric element 1805 is maintained effectively flat with electrode assemblies in slots in piezoelectric element 1805 with conductors folded outward from the slots to contact electrodes on front surface 1802 of piezoelectric element 1805. In other embodiments, piezoelectric element 1805 is maintained flat with each electrode ring in a set of electrode rings extended into a recess in piezoelectric element 1805 in front surface 1802 at an edge of piezoelectric element 1805. In various embodiments, piezoelectric element 1805 can include slots in back surface 1801 to aid in reducing unwanted vibrational modes.

Apparatus 1800 can be constructed such that a single electrode can be used on back surface 1801 and conductive electrode rings can be disposed on front surface 1802. Housing 1807 provides a protective housing for operation of piezoelectric element 1805 arranged as a sensor. Backing material 1804, bonded to piezoelectric element 1805, can be bonded to housing 1807 with epoxy 1818. Backing material 1804 can be bonded to housing 1807 without bonding piezoelectric element 1805 to housing 1807. Electrical conductors 1811 can be provided through openings 1809 in housing 1807. Piezoelectric element 1805 can be realized as a piezoelectric ceramic. Piezoelectric element 1805 can also be arranged as a focused transducer in housing 1807, where housing 1807 can be constructed to be compatible with operation at temperatures and pressures associated with drilling in a borehole.

Figure 19:
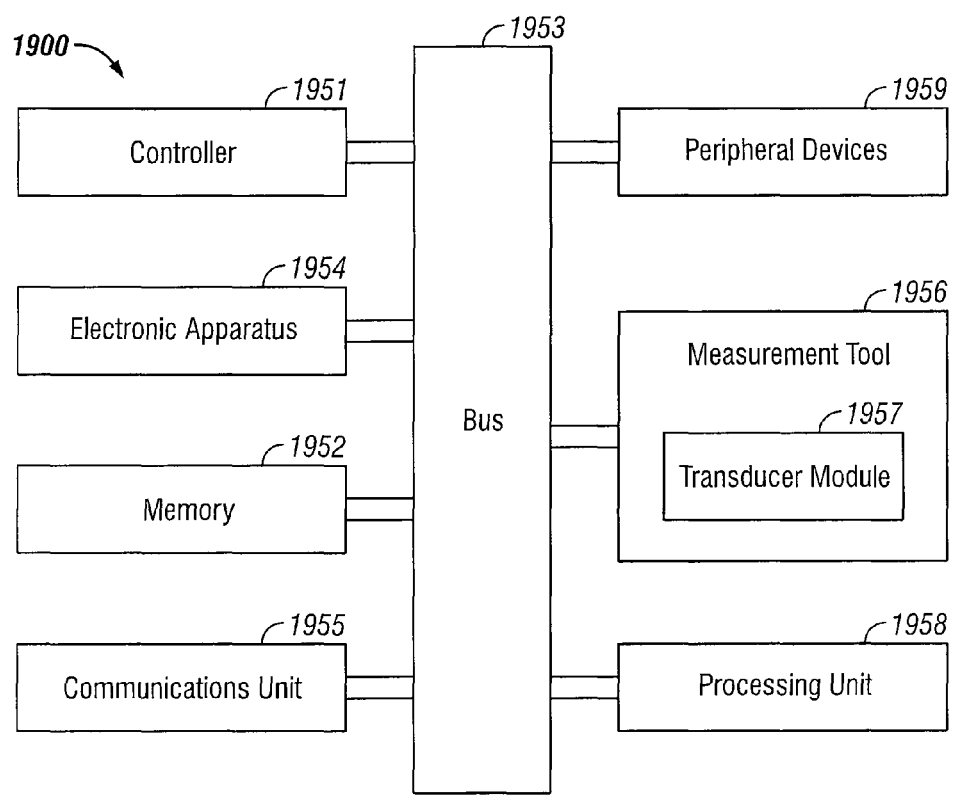
FIG. 19 depicts a block diagram of features of an example system having a tool including a transducer module, in accordance with various embodiments.

FIG. 19 depicts a block diagram of features of an example embodiment of a system 1900 having a measurement tool 1956 including a transducer module 1957 for measurements downhole in a well. Transducer module 1957 can be structured with a configuration such that the sensor of transducer module 1957 is a piezoelectric element having electrical contacts at a side edge of the piezoelectric element such that the front sensing surface of the piezoelectric element is essentially flat without contacts protruding from the face of the piezoelectric element. The piezoelectric element with its front surface electrode structure can be realized in accordance with any of the teachings described herein. The piezoelectric element can be structured to operate in a thickness mode. Transducer module 1957 can be realized as a focused ultrasonic transducer module. Transducer module 1957 can be structured similar to or identical to a configuration associated with any of FIGS. 1-18.

System 1900 can include a controller 1951, a memory 1952, an electronic apparatus 1954, and a communications unit 1955. Controller 1951, memory 1952, and communications unit 1955 can be arranged to operate as a processing unit to control management of measurement tool 1956 and to perform operations on data signals collected by measurement tool 1956. A data processing unit can be distributed among the components of system 1900 including electronic apparatus 1954. Alternatively, system 1900 can include a processing unit 1958 to mange measurement tool 1956.

Communications unit 1955 can include downhole communications for communication to the surface at a well from measurement tool 1956. Such downhole communications can include a telemetry system. Communications unit 1955 may use combinations of wired communication technologies and wireless technologies at frequencies that do not interfere with on-going measurements.

System 1900 can also include a bus 1953, where bus 1953 provides electrical conductivity among the components of system 1900. Bus 1953 can include an address bus, a data bus, and a control bus, each independently configured. Bus 1953 can be realized using a number of different communication mediums that allows for the distribution of components of system 1900. Use of bus 1953 can be regulated by controller 1951.

In various embodiments, peripheral devices 1959 can include displays, additional storage memory, and/or other control devices that may operate in conjunction with controller 1951 and/or memory 1952. In an embodiment, controller 1951 can be realized as a processor or a group of processors that may operate independently depending on an assigned function. Peripheral devices 1959 can be arranged with a display, as a distributed component on the surface, that can be used with instructions stored in memory 1952 to implement a user interface to manage the operation of measurement tool 1956 and/or components distributed within system 1900. Such a user interface can be operated in conjunction with communications unit 1955 and bus 1953.

Figure 20:
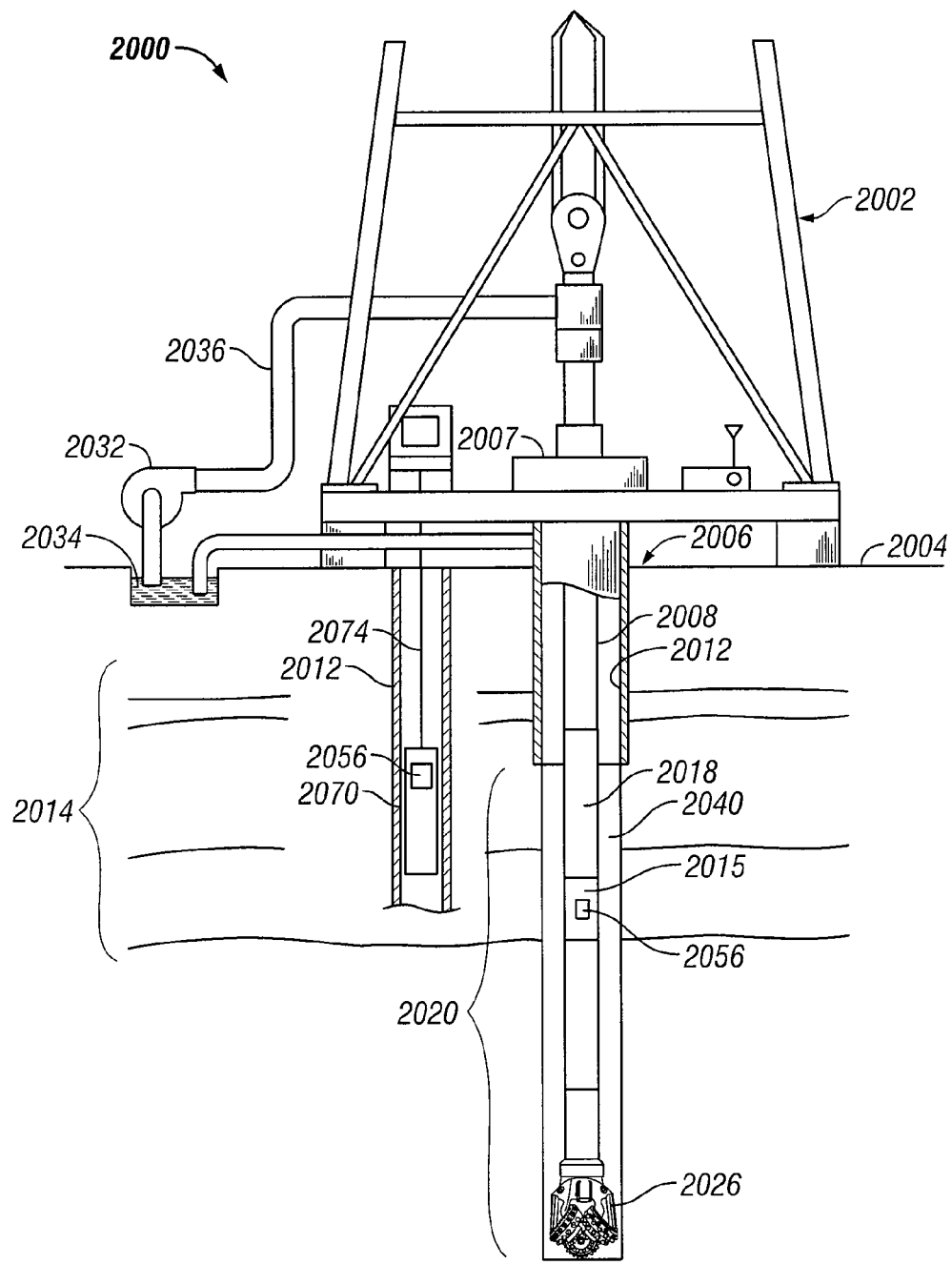
FIG. 20 depicts an example system at a drilling site, where the system includes a measurement tool having a transducer module, in accordance with various embodiments.

FIG. 20 depicts an embodiment of a system 2000 at a drilling site, where system 2000 includes a measurement tool 2056 including a transducer module for measurements downhole in a well. The transducer module can be structured with a configuration such that the sensor of the transducer module is a piezoelectric element having electrical contacts at a side edge of the piezoelectric element such that the front sensing surface of the piezoelectric element is essentially flat without contacts protruding from the face of the piezoelectric element. The piezoelectric element with its front surface electrode structure can be realized in accordance with any of the teachings described herein. The piezoelectric element can be structured to operate in a thickness mode. The transducer module can be realized as a focused ultrasonic transducer module. The transducer module can be structured similar to or identical to a configuration associated with any of FIGS. 1-19, in accordance with the teachings of various embodiments taught herein.

System 2000 can include a drilling rig 2002 located at a surface 2004 of a well 2006 and a string of drill pipes, that is, drill string 2008, connected together so as to form a drilling string that is lowered through a rotary table 2007 into a wellbore or borehole 2012. The drilling rig 2002 can provide support for drill string 2008. The drill string 2008 can operate to penetrate rotary table 2007 for drilling a borehole 2012 through subsurface formations 2014. The drill string 2008 can include drill pipe 2018 and a bottom hole assembly 2020 located at the lower portion of the drill pipe 2018.

The bottom hole assembly 2020 can include drill collar 2015, measurement tool 2056 attached to drill collar 2015, and a drill bit 2026. The drill bit 2026 can operate to create a borehole 2012 by penetrating the surface 2004 and subsurface formations 2014. Measurement tool 2056 can be structured for an implementation in the borehole of a well as a measurements-while-drilling (MWD) system such as a logging-while-drilling (LWD) system. The housing containing measurement tool 2056 can include electronics to manage measurement tool 2056 and collect responses from measurement tool 2056. Such electronics can include a processing unit to analyze signals sensed by measurement tool 2056 and provide measurement results to the surface over a standard communication mechanism for operating a well. Alternatively, the electronics can include a communications interface to provide signals sensed by measurement tool 2056 to the surface over a standard communication mechanism for operating a well, where these sensed signals can be analyzed at a processing unit at the surface.

In various embodiments, measurement tool 2056 may be included in a tool body 2070 coupled to a logging cable 2074 such as, for example, for wireline applications. Tool body 2070 containing measurement tool 2056 can include electronics to manage measurement tool 2056 and collect responses from measurement tool 2056. Such electronics can include a processing unit to analysis signals sensed by measurement tool 2056 and provide measurement results to the surface over a standard communication mechanism for operating a well. Alternatively, the electronics can include a communications interface to provide signals sensed by measurement tool 2056 to the surface over a standard communication mechanism for operating a well, where these collected sensed signals are analyzed at a processing unit at the surface. Logging cable 2074 may be realized as a wireline (multiple power and communication lines), a mono-cable (a single conductor), and/or a slick-line (no conductors for power or communications), or other appropriate structure for use in bore hole 2012.

During drilling operations, the drill string 20020 can be rotated by the rotary table 2007. In addition to, or alternatively, the bottom hole assembly 2020 can also be rotated by a motor (e.g., a mud motor) that is located downhole. The drill collars 2015 can be used to add weight to the drill bit 2026. The drill collars 2015 also can stiffen the bottom hole assembly 2020 to allow the bottom hole assembly 2020 to transfer the added weight to the drill bit 2026, and in turn, assist the drill bit 2026 in penetrating the surface 2004 and subsurface formations 2014.

During drilling operations, a mud pump 2032 can pump drilling fluid (sometimes known by those of skill in the art as "drilling mud") from a mud pit 2034 through a hose 2036 into the drill pipe 2018 and down to the drill bit 2026. The drilling fluid can flow out from the drill bit 2026 and be returned to the surface 2004 through an annular area 2040 between the drill pipe 2018 and the sides of the borehole 2012. The drilling fluid may then be returned to the mud pit 2034, where such fluid is filtered. In some embodiments, the drilling fluid can be used to cool the drill bit 2026, as well as to provide lubrication for the drill bit 2026 during drilling operations. Additionally, the drilling fluid may be used to remove subsurface formation 2014 cuttings created by operating the drill bit 2026.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. A method comprising:
    providing a piezoelectric element having a front surface and a back surface opposite the front surface, the front surface disposed as an active surface of an acoustic transducer;
    forming recesses in the front surface including forming two of the recesses opposite each other on a line through a center of the piezoelectric element; and
    attaching an electrode assembly into each recess such that the front surface remains effectively flat.

2. The method of claim 1, wherein the method includes, after forming the recesses, applying electrode material to the front surface.

3. The method of claim 2, wherein the method includes making cuts in the electrode material forming separate rings in the electrode material.

4. The method of claim 1, wherein attaching each electrode assembly includes, after installing each electrode assembly in its respective slot, folding conductors of each electrode assembly outwards on each side of the respective recess to connect to the piezoelectric element on the front surface.

5. The method of claim 4, wherein the method includes connecting the conductors to the piezoelectric element on each side of the respective recess using conductive epoxy or solder.

6. The method of claim 4, wherein the method includes attaching wires to the conductors of each electrode assembly folded outwards on each side of the respective recess at an outside edge of the piezoelectric element between the front surface and the back surface.

7. The method of claim 1, wherein attaching each electrode assembly includes, after installing each electrode assembly in its respective slot, folding conductors of each electrode assembly outwards on each side of the respective recess to connect to electrodes on the front surface.

8. The method of claim 7, wherein the method includes connecting the conductors to the electrodes using conductive epoxy or solder.

9. The method of claim 7, wherein the method includes attaching wires to the conductors of each electrode assembly folded outwards on each side of the respective recess at an outside edge of the piezoelectric element between the front surface and the back surface.

10. The method of claim 1, wherein the method includes forming a number of slots in the piezoelectric element from the back surface towards the front surface such that the slots do not reach the front surface.

11. The method of claim 1, wherein the method includes lapping the front surface to a specified finish to optimize acoustic performance of the piezoelectric element in the acoustic transducer.

12. The method of claim 1, wherein the method includes attaching the piezoelectric element to a housing, the housing compatible with operation at temperatures and pressures associated with drilling in a borehole.

13. The method of claim 12, wherein the piezoelectric element includes a piezoelectric ceramic.

14. A method comprising:
    forming an acoustic transducer having an active surface, the forming including:
        providing a piezoelectric element having a front surface and a back surface opposite the front surface, the front surface disposed as the active surface of the acoustic transducer;
        forming a recess region in the front surface at an edge of the piezoelectric element;

forming electrodes on the front surface such that the electrodes extend into the recess region; and forming contact wires in the recess region, each contact wire coupled to a respective one of the electrodes different from that to which the other contact wires are coupled such that the coupling is below the front surface within the recess, the contact wires arranged to couple the respective electrodes to wires external to the piezoelectric element.

15. The method of claim 14, wherein the method includes: forming the electrodes on the front surface by forming electrode material on the front surface; and making a number of cuts in the electrode material forming a number of separate electrodes electrically isolated from each other by the cuts such that each separate electrode is continuous into the recess region.

16. The method of claim 15, wherein the method includes bonding each individual contact wire to its respective electrode using conductive epoxy.

17. The method of claim 14, wherein the method includes attaching the piezoelectric element to a housing, the housing compatible with operation at temperatures and pressures associated with drilling in a borehole.

18. The method of claim 17, wherein the piezoelectric element includes a piezoelectric ceramic.

19. An apparatus comprising:

a piezoelectric element structured as part of an acoustic transducer, acoustic transducer having an active surface, the piezoelectric element having a front surface and a back surface opposite the front surface, the front surface disposed as the active surface of the acoustic transducer, the piezoelectric element having recesses in the front surface including two of the recesses being opposite each other on a line through a center of the piezoelectric element;

a number of separate electrodes disposed on the front surface, the number of separate electrodes electrically isolated from each other by an individual opening between each separate electrode and electrodes adjacent the respective electrode; and an electrode assembly in each recess, each electrode assembly having an individual electrical contact within the piezoelectric element to each respective separate electrode, the individual electrical contact arranged to couple the piezoelectric element to wires to couple external from the piezoelectric element such that each electrode on the front surface remains effectively flat in the acoustic transducer.

20. The apparatus of claim 19, wherein the electrode assembly in each recess is arranged such that each electrode assembly has conductors folded outwards on the front surface, each conductor forming one of the individual electrical contacts.

21. The apparatus of claim 20, wherein the piezoelectric element includes a number of slots disposed in the back surface extending from the back surface towards the front surface such that the slots do not reach the front surface.

22. The apparatus of claim 19, wherein the piezoelectric element includes a number of slots disposed in the back surface, the number of slots and number of recesses along with orientation of the slots with respect to the recesses correlated to reduction of modes of vibration during operation of the piezoelectric element in the acoustic transducer.

23. The apparatus of claim 19, wherein the piezoelectric element is arranged as a focused acoustic transducer in a housing, the housing compatible with operation at temperatures and pressures associated with drilling in a borehole.

24. The apparatus of claim 23, wherein the piezoelectric element includes a piezoelectric ceramic.

* * * * *